(12) United States Patent
Webster et al.

(10) Patent No.: US 8,358,458 B2
(45) Date of Patent: Jan. 22, 2013

(54) LOW TEMPERATURE AMORPHOUS SILICON SACRIFICIAL LAYER FOR CONTROLLED ADHESION IN MEMS DEVICES

(75) Inventors: James Randolph Webster, San Jose, CA (US); Thanh Nghia Tu, San Jose, CA (US); Xiaoming Yan, Sunnyvale, CA (US); Wonsuk Chung, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 61 days.

(21) Appl. No.: 12/939,909

(22) Filed: Nov. 4, 2010

(65) Prior Publication Data

US 2011/0051224 A1  Mar. 3, 2011

Related U.S. Application Data

(62) Division of application No. 12/133,813, filed on Jun. 5, 2008, now Pat. No. 7,851,239.

(51) Int. Cl.
*G02B 26/00* (2006.01)
(52) U.S. Cl. .................. 359/290; 359/291; 359/295
(58) Field of Classification Search .................. 359/290, 359/291, 295
See application file for complete search history.

(56) References Cited

U.S. PATENT DOCUMENTS

| 4,190,488 A | 2/1980 | Winters |
| 4,498,953 A | 2/1985 | Cook et al. |
| 4,500,171 A | 2/1985 | Penz et al. |
| 4,519,676 A | 5/1985 | te Velde |
| 4,560,435 A | 12/1985 | Brown et al. |
| 4,566,935 A | 1/1986 | Hornbeck |
| 4,710,732 A | 12/1987 | Hornbeck |
| 4,880,493 A | 11/1989 | Ashby et al. |
| 4,900,395 A | 2/1990 | Syverson et al. |
| 4,954,789 A | 9/1990 | Sampsell |
| 4,956,619 A | 9/1990 | Hornbeck |
| 5,083,857 A | 1/1992 | Hornbeck |
| 5,099,353 A | 3/1992 | Hornbeck |
| 5,124,834 A | 6/1992 | Cusano et al. |
| 5,190,637 A | 3/1993 | Guckel |
| 5,216,537 A | 6/1993 | Hornbeck |
| 5,231,532 A | 7/1993 | Magel et al. |
| 5,293,272 A | 3/1994 | Jannson et al. |
| 5,324,683 A | 6/1994 | Fitch et al. |
| 5,345,328 A | 9/1994 | Fritz et al. |
| 5,358,806 A | 10/1994 | Haraichi et al. |
| 5,381,040 A | 1/1995 | Sun et al. |

(Continued)

FOREIGN PATENT DOCUMENTS

| CN | 1378245 | 11/2002 |
| DE | 199 38 072 | 3/2000 |

(Continued)

OTHER PUBLICATIONS

IPRP dated Dec. 16, 2010 in PCT/US09-046176.

(Continued)

*Primary Examiner* — Evan Pert
(74) *Attorney, Agent, or Firm* — Knobbe, Martens, Olson & Bear, LLP

(57) ABSTRACT

Methods of fabricating an electromechanical systems device that mitigate permanent adhesion, or stiction, of the moveable components of the device are provided. The methods provide an amorphous silicon sacrificial layer with improved and reproducible surface roughness. The amorphous silicon sacrificial layers further exhibit excellent adhesion to common materials used in electromechanical systems devices.

10 Claims, 11 Drawing Sheets

U.S. PATENT DOCUMENTS

| | | | |
|---|---|---|---|
| 5,454,906 A | 10/1995 | Baker et al. | |
| 5,583,688 A | 12/1996 | Hornbeck | |
| 5,646,768 A | 7/1997 | Kaeriyama | |
| 5,656,554 A | 8/1997 | Desai et al. | |
| 5,683,649 A | 11/1997 | Chatterjee et al. | |
| 5,690,839 A | 11/1997 | Min | |
| 5,719,068 A | 2/1998 | Suzawa et al. | |
| 5,726,480 A | 3/1998 | Pister | |
| 5,784,212 A | 7/1998 | Hornbeck | |
| 5,801,084 A | 9/1998 | Beasom et al. | |
| 5,822,110 A | 10/1998 | Dabbaj | |
| 5,825,528 A | 10/1998 | Goossen | |
| 5,835,255 A | 11/1998 | Miles | |
| 5,967,163 A | 10/1999 | Pan et al. | |
| 5,986,796 A | 11/1999 | Miles | |
| 6,008,123 A | 12/1999 | Kook et al. | |
| 6,031,653 A | 2/2000 | Wang | |
| 6,040,937 A | 3/2000 | Miles | |
| 6,046,659 A | 4/2000 | Loo et al. | |
| 6,162,657 A | 12/2000 | Schiele et al. | |
| 6,165,890 A | 12/2000 | Kohl et al. | |
| 6,204,080 B1 | 3/2001 | Hwang | |
| 6,215,221 B1 | 4/2001 | Cabuz et al. | |
| 6,248,654 B1 | 6/2001 | Lee et al. | |
| 6,288,472 B1 | 9/2001 | Cabuz et al. | |
| 6,297,072 B1 | 10/2001 | Tilmans et al. | |
| 6,319,824 B1 | 11/2001 | Lee et al. | |
| 6,337,027 B1 | 1/2002 | Humphrey | |
| 6,342,452 B1 | 1/2002 | Coronel et al. | |
| 6,359,673 B1 | 3/2002 | Stephenson | |
| 6,377,233 B2 | 4/2002 | Colgan et al. | |
| 6,407,851 B1 | 6/2002 | Islam et al. | |
| 6,447,126 B1 | 9/2002 | Hornbeck | |
| 6,448,622 B1 | 9/2002 | Franke et al. | |
| 6,465,320 B1 | 10/2002 | McNeil et al. | |
| 6,574,033 B1 | 6/2003 | Chui et al. | |
| 6,602,791 B2 | 8/2003 | Ouellet et al. | |
| 6,618,187 B2 | 9/2003 | Pilossof | |
| 6,620,712 B2 | 9/2003 | Huang et al. | |
| 6,635,919 B1 | 10/2003 | Melendez et al. | |
| 6,666,979 B2 | 12/2003 | Chinn et al. | |
| 6,674,090 B1 | 1/2004 | Chua et al. | |
| 6,674,562 B1 | 1/2004 | Miles | |
| 6,689,211 B1 | 2/2004 | Wu et al. | |
| 6,713,235 B1 | 3/2004 | Ide et al. | |
| 6,720,267 B1 | 4/2004 | Chen et al. | |
| 6,747,800 B1 | 6/2004 | Lin | |
| 6,756,317 B2 | 6/2004 | Sniegowski et al. | |
| 6,778,306 B2 | 8/2004 | Sniegowski et al. | |
| 6,782,166 B1 | 8/2004 | Grote et al. | |
| 6,794,119 B2 | 9/2004 | Miles | |
| 6,806,110 B2 | 10/2004 | Lester et al. | |
| 6,812,482 B2 | 11/2004 | Fleming et al. | |
| 6,849,471 B2 | 2/2005 | Patel et al. | |
| 6,861,277 B1 | 3/2005 | Monroe et al. | |
| 6,867,896 B2 | 3/2005 | Miles | |
| 6,870,654 B2 | 3/2005 | Lin et al. | |
| 6,872,319 B2 | 3/2005 | Tsai | |
| 6,905,613 B2 | 6/2005 | Gutierrez et al. | |
| 6,913,942 B2 | 7/2005 | Patel et al. | |
| 6,951,824 B2 | 10/2005 | Fischer et al. | |
| 6,952,303 B2 | 10/2005 | Lin et al. | |
| 6,953,702 B2 | 10/2005 | Miller et al. | |
| 6,960,305 B2 | 11/2005 | Doan et al. | |
| 6,972,891 B2 | 12/2005 | Patel et al. | |
| 6,982,820 B2 | 1/2006 | Tsai | |
| 6,995,890 B2 | 2/2006 | Lin | |
| 6,999,225 B2 | 2/2006 | Lin | |
| 6,999,236 B2 | 2/2006 | Lin | |
| 7,008,812 B1 | 3/2006 | Carley | |
| 7,012,726 B1 | 3/2006 | Miles | |
| 7,027,202 B1 | 4/2006 | Hunter et al. | |
| 7,041,224 B2 | 5/2006 | Patel et al. | |
| 7,041,571 B2 | 5/2006 | Strane | |
| 7,049,164 B2 | 5/2006 | Bruner | |
| 7,078,293 B2 | 7/2006 | Lin et al. | |
| 7,110,158 B2 | 9/2006 | Miles | |
| 7,119,945 B2 | 10/2006 | Cummings et al. | |
| 7,123,216 B1 | 10/2006 | Miles | |
| 7,160,752 B2* | 1/2007 | Ouellet et al. | 438/52 |
| 7,172,915 B2 | 2/2007 | Lin et al. | |
| 7,183,637 B2 | 2/2007 | Bruner | |
| 7,198,973 B2 | 4/2007 | Lin et al. | |
| 7,202,101 B2 | 4/2007 | Gabriel et al. | |
| 7,221,495 B2 | 5/2007 | Miles et al. | |
| 7,256,107 B2 | 8/2007 | Takeuchi et al. | |
| 7,291,921 B2 | 11/2007 | Lin | |
| 7,321,457 B2 | 1/2008 | Heald | |
| 7,327,510 B2 | 2/2008 | Cummings et al. | |
| 7,369,296 B2* | 5/2008 | Floyd | 359/290 |
| 7,420,728 B2 | 9/2008 | Tung et al. | |
| 7,429,334 B2 | 9/2008 | Tung et al. | |
| 7,446,926 B2 | 11/2008 | Sampsell | |
| 7,450,295 B2 | 11/2008 | Tung et al. | |
| 7,459,402 B2 | 12/2008 | Doan et al. | |
| 7,492,502 B2 | 2/2009 | Chui et al. | |
| 7,527,996 B2 | 5/2009 | Luo et al. | |
| 7,534,640 B2 | 5/2009 | Sasagawa et al. | |
| 7,547,565 B2 | 6/2009 | Lin et al. | |
| 7,547,568 B2 | 6/2009 | Chou et al. | |
| 7,556,917 B2 | 7/2009 | Miles | |
| 7,561,321 B2 | 7/2009 | Heald | |
| 7,569,488 B2 | 8/2009 | Rafanan | |
| 7,616,369 B2 | 11/2009 | Miles et al. | |
| 7,623,287 B2 | 11/2009 | Sasagawa et al. | |
| 7,642,110 B2 | 1/2010 | Miles | |
| 7,706,044 B2 | 4/2010 | Lin et al. | |
| 7,719,752 B2 | 5/2010 | Sampsell et al. | |
| 7,723,015 B2 | 5/2010 | Miles | |
| 7,733,552 B2 | 6/2010 | Londergan et al. | |
| 7,763,546 B2 | 7/2010 | Kothari et al. | |
| 7,795,061 B2 | 9/2010 | Wang et al. | |
| 7,835,093 B2 | 11/2010 | Wang | |
| 7,851,239 B2 | 12/2010 | Webster et al. | |
| 7,952,789 B2 | 5/2011 | Tung et al. | |
| 2001/0003487 A1 | 6/2001 | Miles | |
| 2002/0003400 A1 | 1/2002 | Lee | |
| 2002/0014579 A1 | 2/2002 | Dunfield | |
| 2002/0021485 A1 | 2/2002 | Pilossof | |
| 2002/0027636 A1 | 3/2002 | Yamada | |
| 2002/0055253 A1 | 5/2002 | Rudhard | |
| 2002/0086455 A1 | 7/2002 | Franosch et al. | |
| 2002/0110948 A1 | 8/2002 | Huang et al. | |
| 2002/0117728 A1 | 8/2002 | Brosnihan et al. | |
| 2002/0155717 A1 | 10/2002 | Sniegowski et al. | |
| 2003/0003682 A1 | 1/2003 | Moll et al. | |
| 2003/0003761 A1 | 1/2003 | Yang et al. | |
| 2003/0006468 A1 | 1/2003 | Ma et al. | |
| 2003/0029831 A1 | 2/2003 | Kawase | |
| 2003/0047533 A1 | 3/2003 | Reid et al. | |
| 2003/0071015 A1 | 4/2003 | Chinn et al. | |
| 2003/0072070 A1 | 4/2003 | Miles | |
| 2003/0111439 A1 | 6/2003 | Fetter et al. | |
| 2003/0138986 A1 | 7/2003 | Bruner | |
| 2003/0141561 A1 | 7/2003 | Fischer et al. | |
| 2003/0202264 A1 | 10/2003 | Weber et al. | |
| 2003/0202265 A1 | 10/2003 | Reboa et al. | |
| 2003/0214639 A1 | 11/2003 | Patel et al. | |
| 2004/0028849 A1 | 2/2004 | Stark et al. | |
| 2004/0035821 A1 | 2/2004 | Doan et al. | |
| 2004/0038513 A1 | 2/2004 | Kohl et al. | |
| 2004/0053434 A1 | 3/2004 | Bruner | |
| 2004/0080832 A1 | 4/2004 | Singh | |
| 2004/0124483 A1 | 7/2004 | Partridge et al. | |
| 2004/0124495 A1 | 7/2004 | Chen et al. | |
| 2004/0132243 A1 | 7/2004 | Kurosawa | |
| 2004/0136076 A1 | 7/2004 | Tayebati | |
| 2004/0159629 A1 | 8/2004 | Busta | |
| 2004/0191937 A1 | 9/2004 | Patel et al. | |
| 2004/0191946 A1 | 9/2004 | Patel et al. | |
| 2004/0197526 A1 | 10/2004 | Mehta | |
| 2004/0207898 A1 | 10/2004 | Lin et al. | |
| 2004/0209195 A1 | 10/2004 | Lin | |
| 2004/0217264 A1 | 11/2004 | Wood et al. | |
| 2004/0244191 A1 | 12/2004 | Orr et al. | |
| 2005/0014374 A1 | 1/2005 | Partridge et al. | |
| 2005/0020089 A1 | 1/2005 | Shi et al. | |

| | | | |
|---|---|---|---|
| 2005/0034822 A1 | 2/2005 | Kim et al. | |
| 2005/0045276 A1 | 3/2005 | Patel et al. | |
| 2005/0098840 A1 | 5/2005 | Fuertsch et al. | |
| 2005/0118832 A1 | 6/2005 | Korzenski et al. | |
| 2005/0124135 A1 | 6/2005 | Ayazi et al. | |
| 2005/0170670 A1 | 8/2005 | King et al. | |
| 2005/0195462 A1 | 9/2005 | Lin | |
| 2005/0226281 A1 | 10/2005 | Faraone et al. | |
| 2005/0266599 A1 | 12/2005 | Ikegami | |
| 2006/0037933 A1 | 2/2006 | Wang et al. | |
| 2006/0066932 A1 | 3/2006 | Chui | |
| 2006/0067650 A1 | 3/2006 | Chui | |
| 2006/0077503 A1 | 4/2006 | Palmateer et al. | |
| 2006/0234412 A1 | 10/2006 | Lazaroff | |
| 2007/0041076 A1 | 2/2007 | Zhong et al. | |
| 2007/0093045 A1 | 4/2007 | Yamaguchi et al. | |
| 2007/0111533 A1 | 5/2007 | Korzenski et al. | |
| 2007/0170540 A1 | 7/2007 | Chung et al. | |
| 2007/0249078 A1 | 10/2007 | Tung et al. | |
| 2007/0249079 A1 | 10/2007 | Sasagawa et al. | |
| 2008/0003784 A1 | 1/2008 | Pan | |
| 2008/0130089 A1 | 6/2008 | Miles | |
| 2008/0226929 A1 | 9/2008 | Chung et al. | |
| 2009/0022884 A1 | 1/2009 | Chui et al. | |
| 2009/0315567 A1 | 12/2009 | Chou et al. | |
| 2009/0323168 A1 | 12/2009 | Miles et al. | |
| 2010/0147790 A1 | 6/2010 | Sasagawa et al. | |
| 2010/0149627 A1 | 6/2010 | Sasagawa et al. | |
| 2010/0182675 A1 | 7/2010 | Sampsell et al. | |
| 2010/0202039 A1 | 8/2010 | Kogut et al. | |
| 2010/0271688 A1 | 10/2010 | Wang et al. | |
| 2010/0320555 A1 | 12/2010 | Miles et al. | |

FOREIGN PATENT DOCUMENTS

| | | |
|---|---|---|
| EP | 0 035 299 | 9/1983 |
| EP | 0 788 005 | 8/1997 |
| EP | 1 209 738 | 5/2002 |
| EP | 1 452 481 | 9/2004 |
| JP | 49-004993 | 1/1974 |
| JP | 01-102415 | 4/1989 |
| JP | 05275401 | 10/1993 |
| JP | 06-350105 | 12/1994 |
| JP | 07-098326 | 4/1995 |
| JP | 07-060844 | 7/1995 |
| JP | 10-020328 | 1/1998 |
| JP | 10-148644 | 6/1998 |
| JP | 10-209176 | 8/1998 |
| JP | 11-258777 | 9/1999 |
| JP | 2001-085519 | 3/2001 |
| JP | 2002-287047 | 3/2001 |
| JP | 2002-207182 | 7/2002 |
| JP | 2002-243937 | 8/2002 |
| JP | 2002-328313 | 11/2002 |
| JP | 2003-001598 | 1/2003 |
| JP | 2003-340795 | 12/2003 |
| JP | 2004-106074 | 4/2004 |
| JP | 2004-133281 | 4/2004 |
| JP | 2005-028504 | 3/2005 |
| JP | 2005-193336 | 7/2005 |
| TW | 546833 | 8/2003 |
| WO | WO 91/005284 | 4/1991 |
| WO | WO 92/10925 | 6/1992 |
| WO | WO 98/29748 | 7/1998 |
| WO | WO 01/14248 | 3/2001 |
| WO | WO 01/63657 | 8/2001 |
| WO | WO 02/24570 | 3/2002 |
| WO | WO 02/075803 | 9/2002 |
| WO | WO 03/107094 | 12/2003 |
| WO | WO 2004/003981 | 1/2004 |
| WO | WO 2004/055885 | 7/2004 |
| WO | WO 2004/079056 | 9/2004 |
| WO | WO 2004/087561 | 10/2004 |
| WO | WO 2005/061378 | 7/2005 |
| WO | WO 2006/113492 | 10/2006 |
| WO | WO 2008/046682 | 4/2008 |
| WO | WO 2009/041948 | 4/2009 |

OTHER PUBLICATIONS

Dokmeci et al., Dec. 2004, Two-axis single-crystal silicon micromirror arrays, Journal of Microelectromechanical Systems, 13(6):1006-1017.

Boucinha et al., 2000, Amorphous silicon air-gap resonators on large-area substrates, Applied Physics Letters, 77(6):907-909.

Chung et al., 2005, Fabrication and characterization of amorphous Si films by PECVD for MEMS, J. Micromech. Microeng. 15:136-142.

Iliescu et al., Thick and low-stress PECVC amorphous silicon for MEMS applications, J. Micromech. Microeng. 18 (2008) 015024, 8 pp.

Yao et al., BrF3 dry release technology for large freestanding parylene microstructures and electrostatic actuators, Sensors and Actuators A, 97-98:771-775, Apr. 2002.

ISR and WO dated Jun. 30, 2010 in PCT/US09-046176.

Aratani et al., Process and Design Considerations for Surface Micromachined Beams for a Tuneable Interferometer Array in Silicon, Proc. IEEE Microelectromechanical Workshop, Fort Lauderdale, FL, pp. 230-235 (Feb. 1993).

Aratani K. et al. Surface Micromachined Tuneable Interferometer Array, Sensors and Actuators A, Elsevier Sequoia S.A., Lausanne, CH, A43(1/3):17-23, May 1, 1994.

Ibbotson et al., Comparison of XeF2 and F-atom reactions with Si and SiO2, Applied Physics Letters, 44(12):1129-1131 (Jun. 1984).

Liu et al., Oct. 2004, Vertical profiles and cd loss control in deep REI technology, Solid-State and Integrated Circuits Technology, 7th International Conference, pp. 1848-1851.

Raley et al., A Fabry-Perot Microinterferometer for Visible Wavelengths, IEEE Solid-State Sensor and Actuator Workshop, Hilton Head, SC, pp. 170-173 (1992).

Rusu et al., 2001, Planarization of deep trenches, Proc. SPIE, 4557:49-57.

Sridharan et al. Post-packaging Release a New Concept for Surface-Micromachined Devices Technical Digest, IEEE Solid-State Sensor & Actuator Workshop, New York, NY US Nov. 8, 1998 pp. 225-228.

Williams, et al. Etch Rates for Micromachining Processing. Journal of Microelectromechanical Systems, 5(4):256-259, (Dec. 1996).

Williams et al., Dec. 2003, Etch rates for micromachining processing—part II, Journal of Microelectromechanical Systems, 12(6):761-778.

Winters, et al. The etching of silicon with XeF2 vapor. Applied Physics Letters, 34(1):70-73, (Jan. 1979).

Gu et al., Apr. 2005, Study on growth mechanism of low-temperature prepared microcrystalline Si thin films, 54(4):1890-1894.

Office Action dated Jan. 10, 2012 in Chinese App. No. 2009780120517.1.

* cited by examiner

|  | Column Output Signals | |
|---|---|---|
| Row Output Signals | $+V_{bias}$ | $-V_{bias}$ |
| 0 | Stable | Stable |
| $+\Delta V$ | Relax | Actuate |
| $-\Delta V$ | Actuate | Relax |

LOW TEMPERATURE AMORPHOUS SILICON SACRIFICIAL LAYER FOR CONTROLLED ADHESION IN MEMS DEVICES

CROSS-REFERENCE TO RELATED APPLICATIONS

This application is a divisional application of U.S. application Ser. No. 12/133,813, filed on Jun. 5, 2008 and entitled "Low Temperature Amorphous Silicon Sacrificial Layer for Controlled Adhesion in MEMS Devices," the contents of which are hereby incorporated by reference in their entirety.

BACKGROUND

1. Field of the Invention

Embodiments relate to methods of selecting deposition conditions of a sacrificial layer comprising amorphous silicon such that the sacrificial layer can provide enhanced surface roughness to an overlaying layer. Other embodiments relate to an unreleased microelectromechanical systems device that includes an interface between the sacrificial layer and the overlaying metal layer having a surface roughness that is effective to reduce stiction between the metal layer and the optical stack after removal of the sacrificial layer to form a cavity.

2. Description of the Related Art

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Preferred Embodiments" one will understand how the features of this invention provide advantages over other display devices.

One aspect provides a method of manufacturing a MEMS device that includes selecting deposition conditions having a deposition temperature that is less than or equal to about 250° C. For example, the deposition temperature can range from about 150° C. to about 250° C. The method can further include depositing a sacrificial layer that includes amorphous silicon over an optical stack under the selected deposition conditions.

Another aspect provides an unreleased MEMS substrate that includes an optical stack, a sacrificial layer, and a metal layer overlaying and forming an interface with the sacrificial layer. The sacrificial layer can include amorphous silicon. The interface of the sacrificial layer and the metal layer includes a surface roughness that is effective to reduce stiction between the metal layer and the optical stack after removal of the sacrificial layer to form a cavity.

These and other embodiments are described in greater detail below.

The Figures are not drawn to scale.

DETAILED DESCRIPTION OF PREFERRED EMBODIMENT

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Described herein are controllable processes for depositing an amorphous silicon sacrificial layer at a low temperature in the manufacture of a MEMS device. The amorphous silicon sacrificial layer exhibits excellent adhesion to other common MEMS device materials, e.g., metals and dielectrics, excellent reproducibility of surface roughness, which can be transferred to an overlying layer, and enhanced performance in gas-phase release processes. The moveable layer of the MEMS device made in accordance with the methods described herein has a surface roughness that is effective to reduce stiction between the metal layer and the optical stack after removal of the sacrificial layer.

Figure 1:
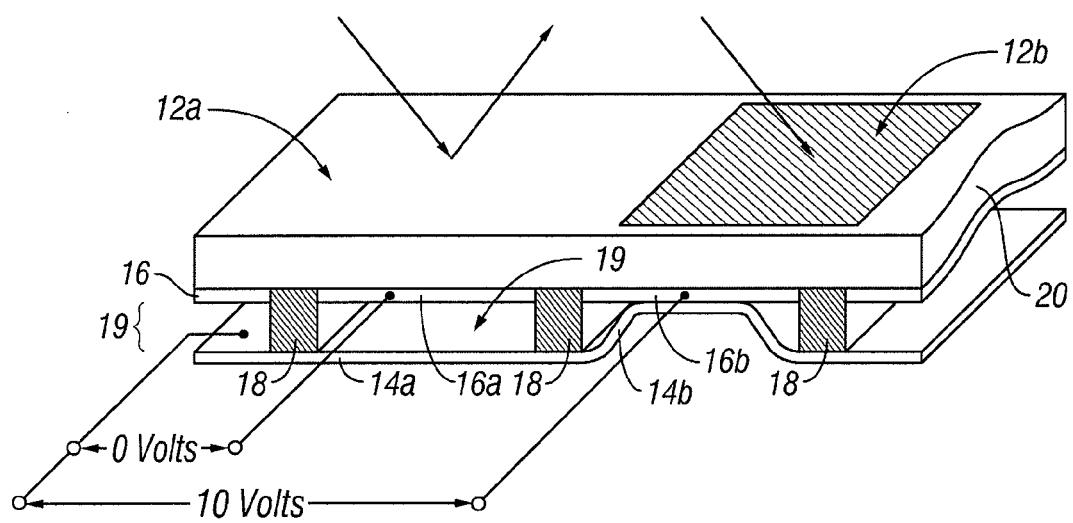
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
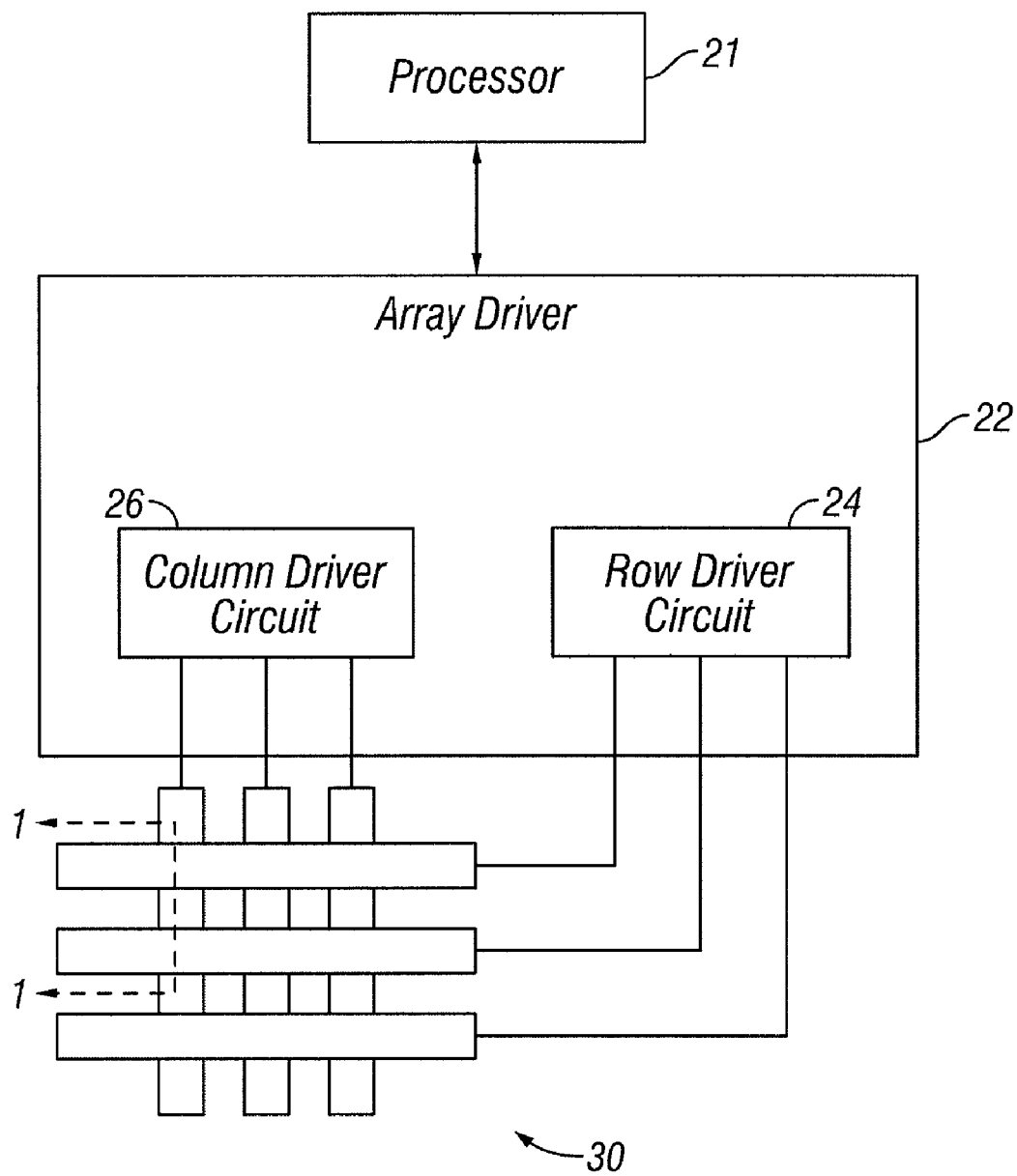
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
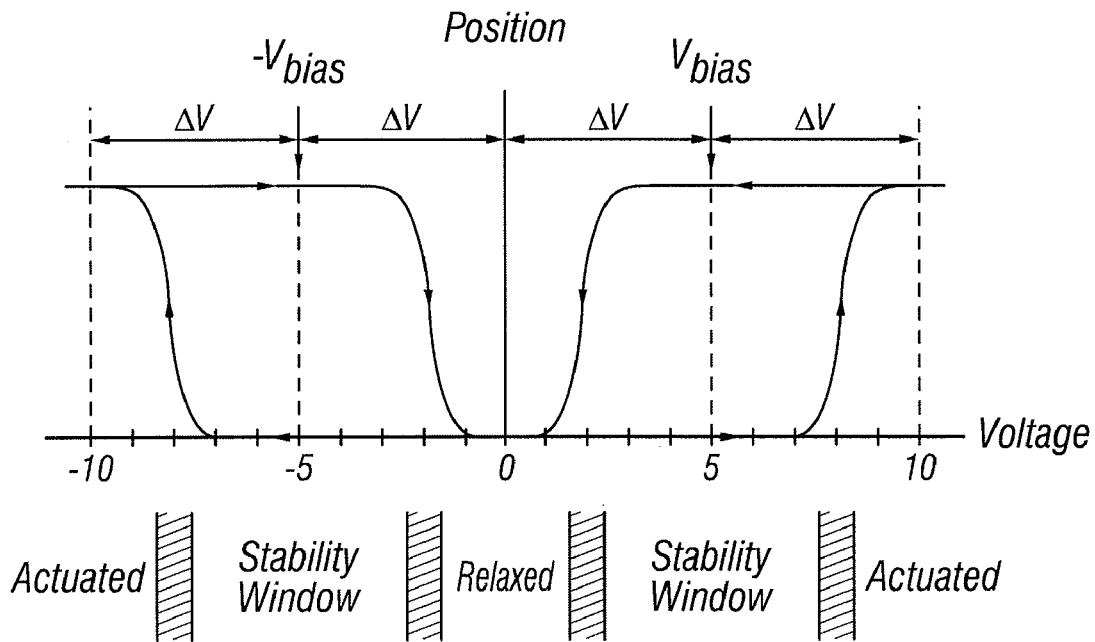
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
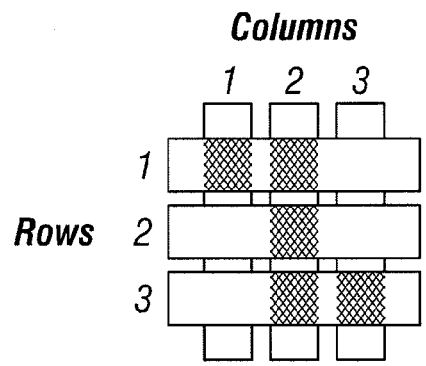
FIG. 5A illustrates one exemplary frame of display data in the 3×3 interferometric modulator display of FIG. 2.
Figure 5B:
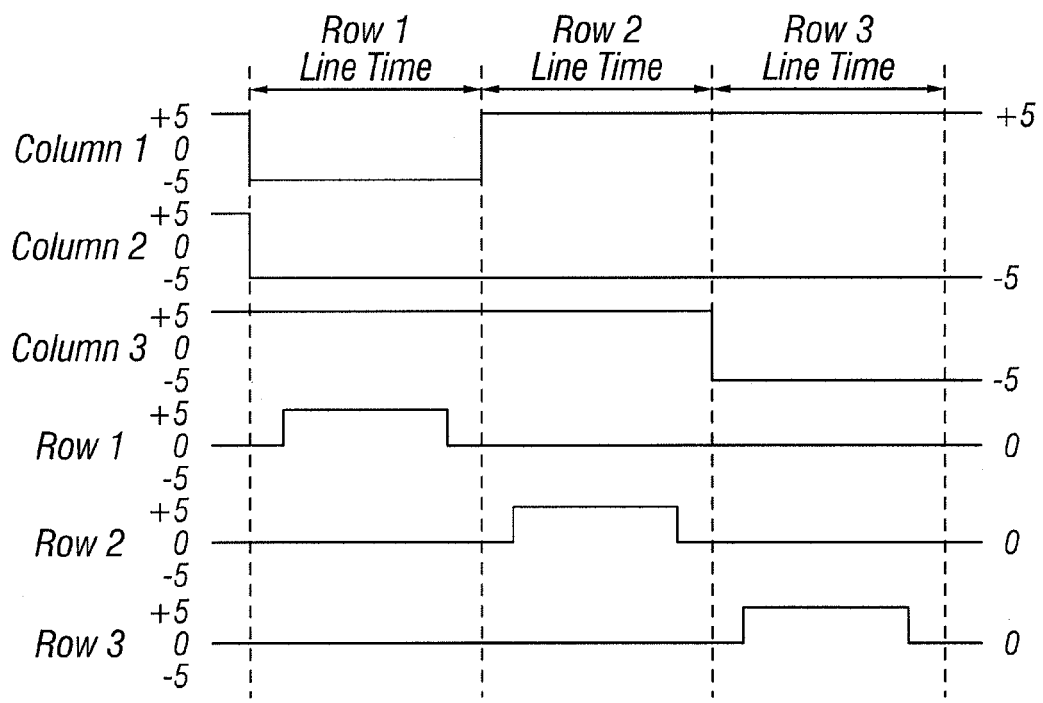
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts, respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
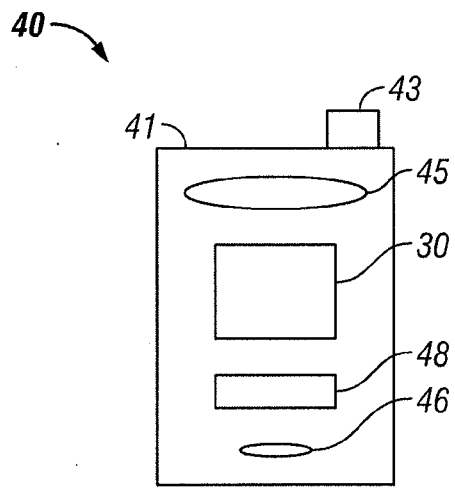
FIGS. 6A and 6B are system block diagrams illustrating an embodiment of a visual display device comprising a plurality of interferometric modulators.
Figure 6B:
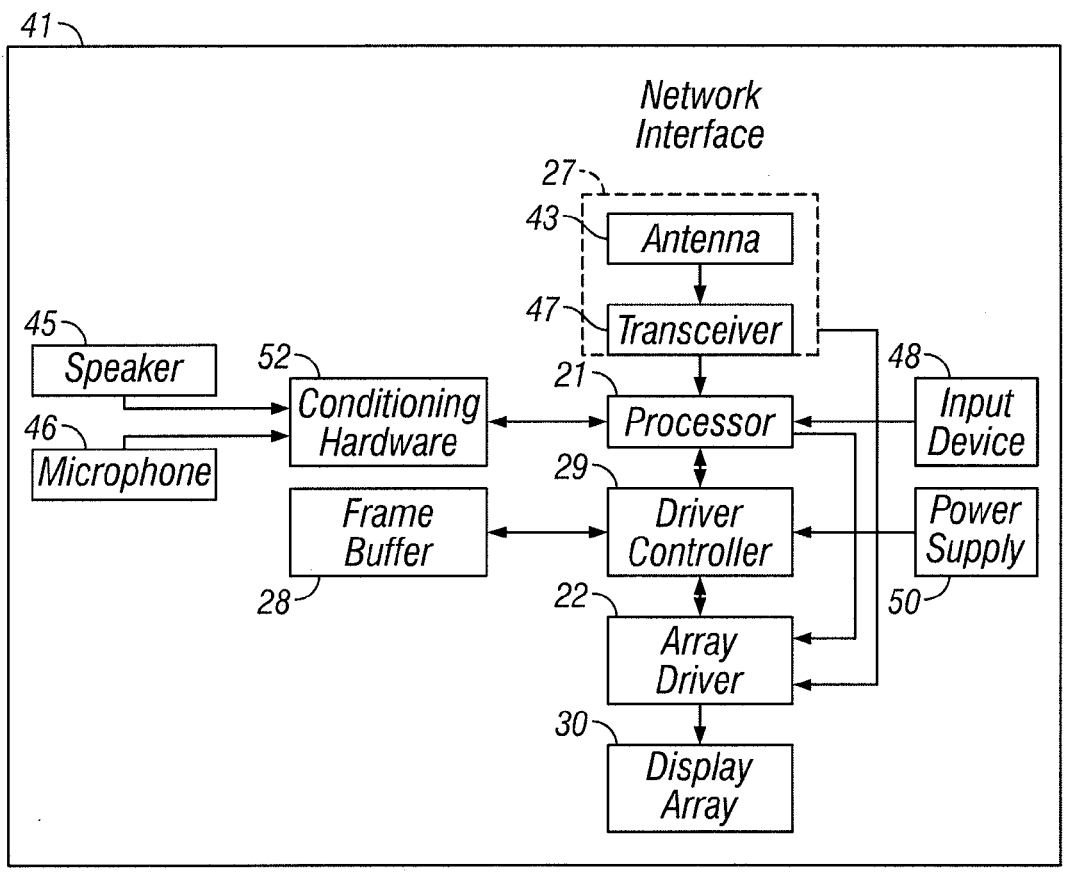

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
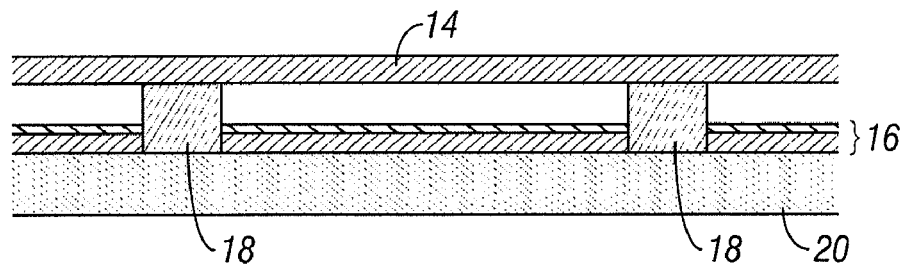
FIG. 7A is a cross section of the device of FIG. 1.
Figure 7B:
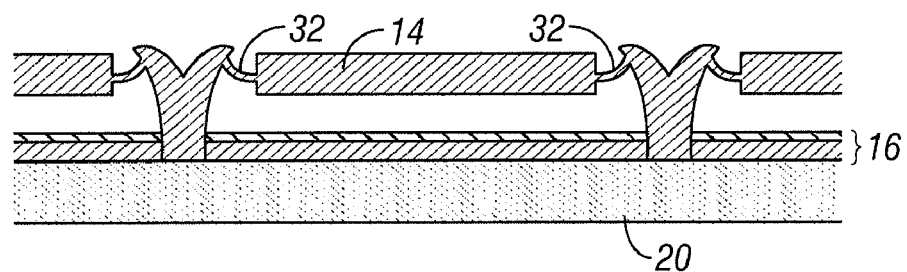
FIG. 7B is a cross section of an alternative embodiment of an interferometric modulator.
Figure 7C:
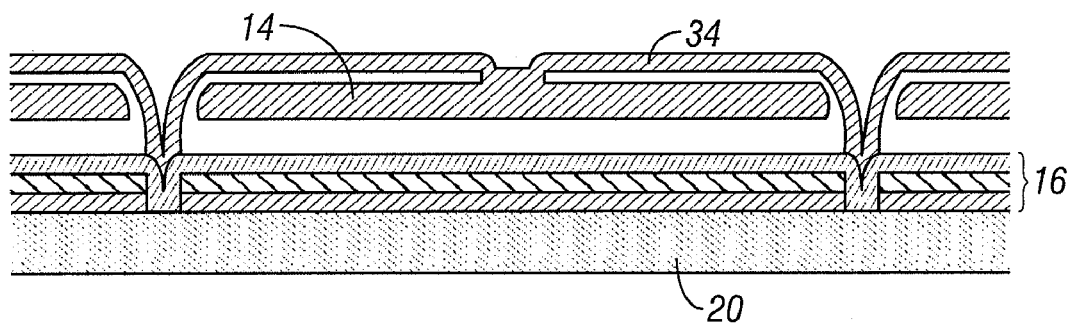
FIG. 7C is a cross section of another alternative embodiment of an interferometric modulator.
Figure 7D:
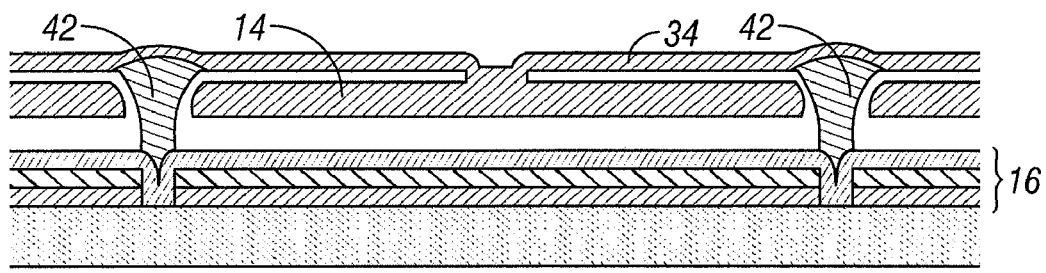
FIG. 7D is a cross section of yet another alternative embodiment of an interferometric modulator.
Figure 7E:
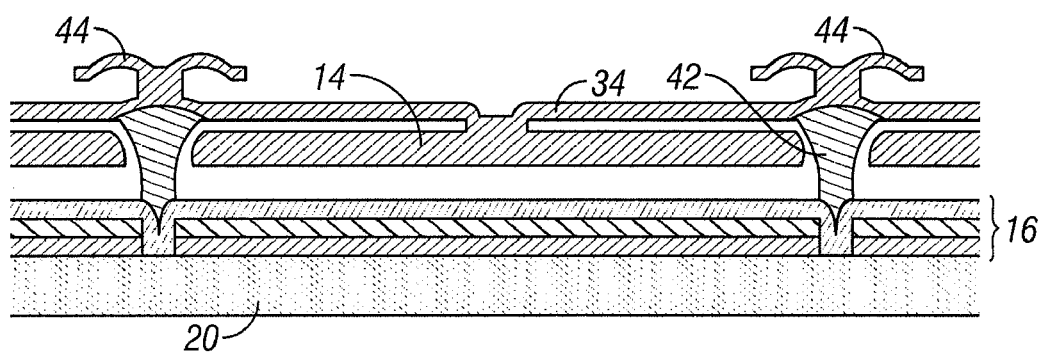
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

The interferometric modulators described above may be manufactured using any suitable manufacturing techniques known in the art for making MEMS devices. For example, the various material layers making up the interferometric modulators may be sequentially deposited onto a transparent substrate with appropriate patterning and etching steps conducted between deposition steps. In some embodiments, multiple layers may be deposited during interferometric modulator manufacturing without any etching steps between the deposition steps. For example, the movable reflective layer described above may comprise a composite structure having two or more layers.

Figure 8:
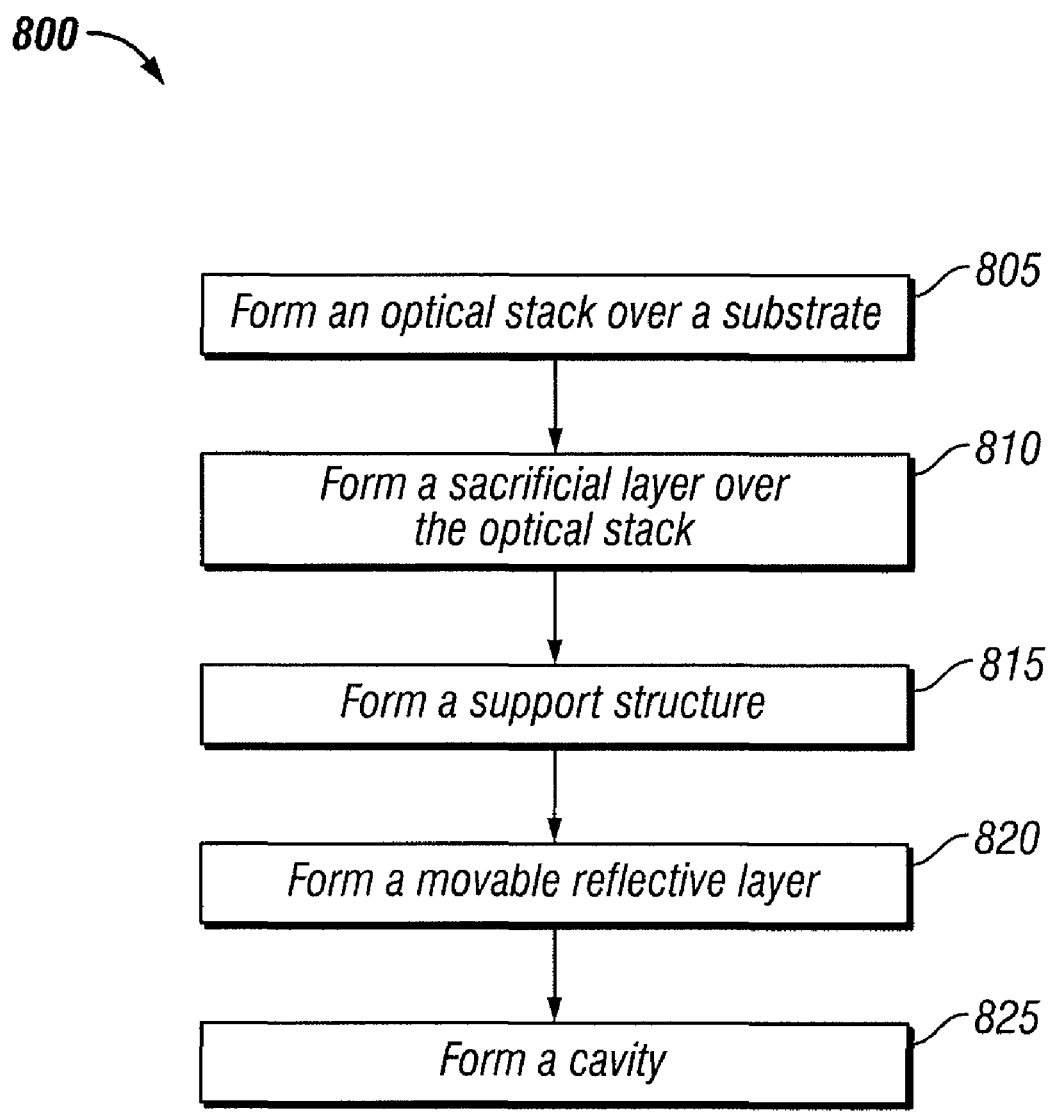
FIG. 8 is a flow diagram illustrating certain steps in an embodiment of a method of making an interferometric modulator.

FIG. 8 illustrates certain steps in an embodiment of a manufacturing process 800 for an interferometric modulator. Such steps may be present in a process for manufacturing, e.g., interferometric modulators of the general type illustrated in FIGS. 1 and 7, along with other steps not shown in FIG. 8. With reference to FIGS. 1, 7 and 8, the process 800 begins at step 805 with the formation of the optical stack 16 over the substrate 20. The substrate 20 may be a transparent substrate such as glass or plastic and may have been subjected to prior preparation step(s), e.g., cleaning, to facilitate efficient formation of the optical stack 16. As discussed above, the optical stack 16 is electrically conductive, partially transparent and partially reflective, and may be fabricated, for example, by depositing one or more of the layers onto the transparent substrate 20. In some embodiments, the layers are patterned into parallel strips, and may form row electrodes in a display device. In some embodiments, the optical stack 16 includes an insulating or dielectric layer that is deposited over one or more metal layers (e.g., reflective and/or conductive layers).

The process 800 illustrated in FIG. 8 continues at step 810 with the formation of a sacrificial layer over the optical stack 16. The sacrificial layer is later removed (e.g., at step 825) to form the gap 19 as discussed below and thus the sacrificial layer is not shown in the resulting interferometric modulator 12 illustrated in FIGS. 1 and 7. The formation of the sacrificial layer over the optical stack 16 may include deposition of a $XeF_2$-etchable material such as molybdenum or amorphous silicon, in a thickness selected to provide, after subsequent removal, a gap 19 having the desired size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

The process 800 illustrated in FIG. 8 continues at step 815 with the formation of a support structure e.g., a post 18 as illustrated in FIGS. 1 and 7. The formation of the post 18 may include the steps of patterning the sacrificial layer to form a support structure aperture, then depositing a material (e.g., a polymer) into the aperture to form the post 18, using a deposition method such as PECVD, thermal CVD, or spin-coating. In some embodiments, the support structure aperture formed in the sacrificial layer extends through both the sacrificial layer and the optical stack 16 to the underlying substrate 20, so that the lower end of the post 18 contacts the substrate 20 as illustrated in FIG. 7A. In other embodiments, the aperture formed in the sacrificial layer extends through the sacrificial layer, but not through the optical stack 16. For example, FIG. 7C illustrates the lower end of the support post plugs 42 in contact with the optical stack 16.

The process 800 illustrated in FIG. 8 continues at step 820 with the formation of a movable reflective layer such as the movable reflective layer 14 illustrated in FIGS. 1 and 7. The movable reflective layer 14 may be formed by employing one or more deposition steps, e.g., reflective layer (e.g., aluminum, aluminum alloy) deposition, along with one or more patterning, masking, and/or etching steps. As discussed above, the movable reflective layer 14 is typically electrically conductive, and may be referred to herein as an electrically conductive layer. Since the sacrificial layer is still present in the partially fabricated interferometric modulator formed at step 820 of the process 800, the movable reflective layer 14 is typically not movable at this stage. A partially fabricated interferometric modulator that contains a sacrificial layer may be referred to herein as an "unreleased" interferometric modulator.

The process 800 illustrated in FIG. 8 continues at step 825 with the formation of a gap, e.g., a gap 19 as illustrated in FIGS. 1 and 7. The gap 19 may be formed by exposing the sacrificial material (deposited at step 810) to an etchant. For example, an etchable sacrificial material such as molybdenum or amorphous silicon may be removed by dry chemical etching, e.g., by exposing the sacrificial layer to a gaseous or vaporous etchant, such as vapors derived from solid xenon difluoride ($XeF_2$) for a period of time that is effective to remove the desired amount of material, typically selectively relative to the structures surrounding the gap 19. Other etching methods, e.g. wet etching and/or plasma etching, may also be used. Since the sacrificial layer is removed during step 825 of the process 800, the movable reflective layer 14 is typically movable after this stage. After removal of the sacrificial material, the resulting fully or partially fabricated interferometric modulator may be referred to herein as a "released" interferometric modulator.

Stiction can be one of the most important reliability issues in MEMS devices in general and interferometric modulators in particular. "Stiction," as used herein, refers to a tendency of a movable layer in an actuated position to stick to a stationary layer in a microelectromechanical system. The adhesion forces that are present in stiction become more significant when decreasing device dimensions. This is because the restoring forces that counteract the adhesion forces also decrease with decreasing device sizes. Accordingly, there is a need to provide a solution to the stiction problem in microelectromechanical systems.

Stiction can be influenced by the roughness of the surfaces that come into contact, e.g., the surface roughnesses of the moveable layer and/or the stationary layer. Generally, in the manufacture of a MEMS device, the moveable layer is initially formed over a sacrificial material, and then the sacrificial layer is subsequently removed to form a cavity such that the moveable layer can be actuated to contact the stationary layer. Before its removal, the surface roughness properties of the sacrificial layer can be directly transferred to a layer (e.g., the moveable layer) subsequently formed thereon. Therefore, by using novel methods to provide increased surface roughness to the sacrificial layer, one can reduce the stiction between a moveable layer and a stationary layer in a MEMS device.

With reference to FIG. 1, stiction can cause, for example, the actuated movable layer 14b to remain in contact with the optical stack 16b, even in the presence of a restoring force that would be expected to return the movable layer 14b to the non-actuated position. Stiction occurs when the total of several adhesion forces, arising from various adhesion mechanisms, are greater than the restoring force. The restoring force includes the combined mechanical tension forces in the actuated movable layer and the electrostatic forces caused by the applied voltage. Since surface forces become more significant with decreasing device dimensions, and restoring forces shrink with decreasing device dimensions, stiction is a concern for MEMS devices including interferometric modulators.

Adhesion forces may arise from several mechanisms including, for example, capillary forces, van der Waals interactions, chemical bonds and trapped charges. Adhesion forces due to all of these mechanisms, in varying degrees, depend on the contact area and surface separation between the various movable and stationary layers when in the actuated state. Embodiments provide methods of manufacturing MEMS devices with increased moveable layer surface roughness, thereby resulting in lower adhesion forces and more favorable performance due to less stiction.

Described herein is a method of manufacturing a microelectromechanical systems (MEMS) device. In an embodiment, the method comprises selecting deposition conditions that comprise a deposition temperature that is less than or equal to about 250° C. and depositing a sacrificial layer over an optical stack under the selected deposition conditions, wherein, the sacrificial layer comprises amorphous silicon.

Figure 9:
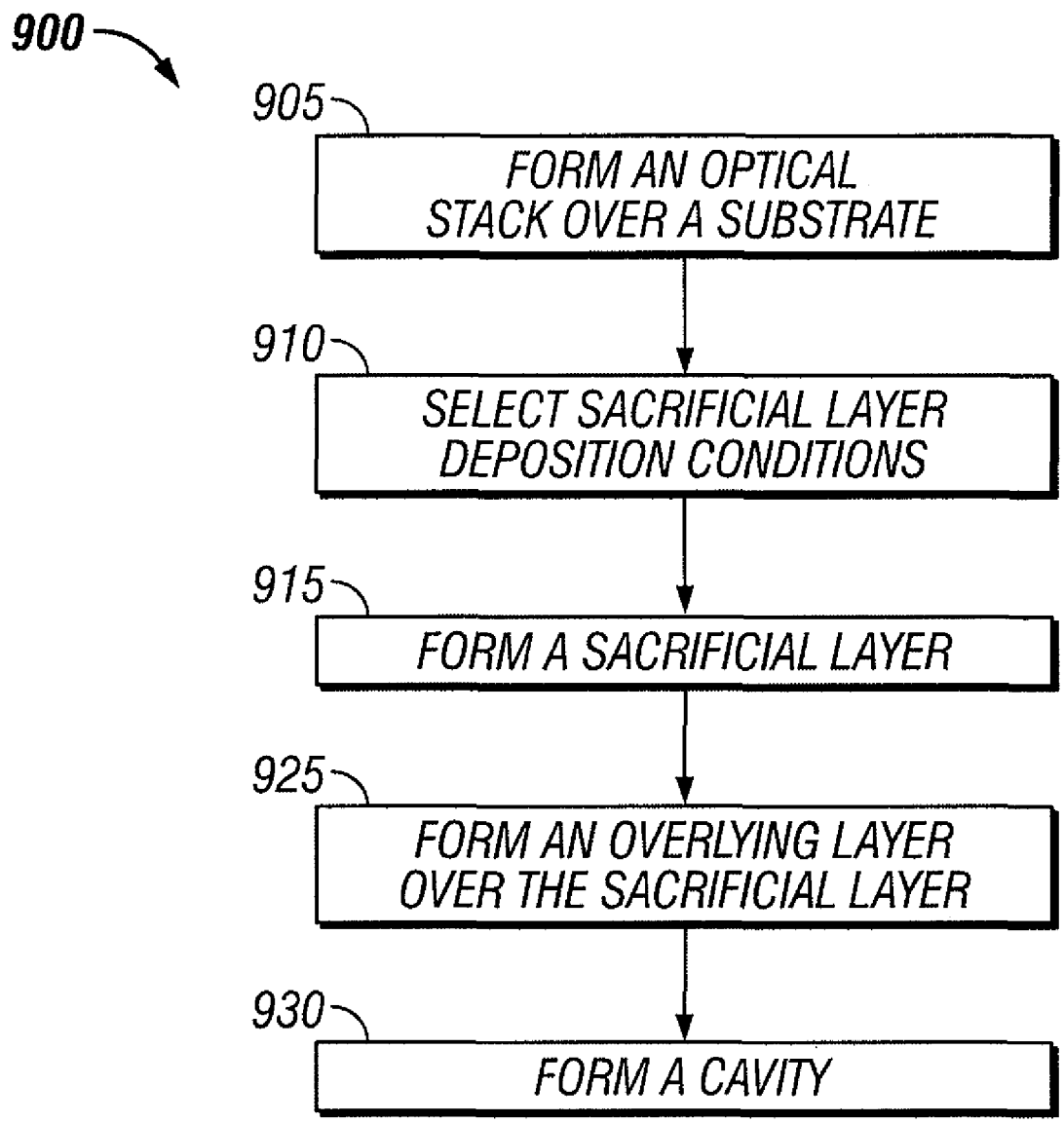
FIG. 9 is a flow diagram illustrating an embodiment of a method of making a MEMS device.

FIG. 9 is a flow diagram illustrating certain steps in an embodiment of a method of making a MEMS device that includes selecting appropriate deposition conditions and forming a sacrificial layer as described herein. Such steps may be present in a process for manufacturing, e.g., interferometric modulators of the general type illustrated in FIGS. 1, 7, 10, and 11, along with other steps not shown in FIG. 9. With reference to FIGS. 9 and 10, the process 900 begins at step 905 with the formation of an optical stack 102 over a substrate (not illustrated). The materials and processing steps used in step 805 in FIG. 8 can be analogously used in step 905 of FIG. 9. For example, the optical stack can comprise a dielectric layer and/or an electrode layer and a partially reflective layer. In an embodiment, the dielectric layer comprises a dielectric material selected from a silicon oxide and an aluminum oxide. In an embodiment, the method comprises depositing the sacrificial layer onto the dielectric layer.

The process 900 continues at step 910 with selecting deposition conditions for the sacrificial layer 104. The selected deposition conditions can comprise any deposition technique useful in forming the sacrificial layer at a low temperature, e.g., less than or equal to about 250° C. For example, the deposition technique can be selected from chemical vapor deposition (CVD), PECVD, and evaporation deposition. A sacrificial layer comprising amorphous silicon having desirable roughness can be formed using PECVD technique.

The selected deposition conditions 910 can include use of one or more gases, e.g. feed gases, which facilitate the formation of the amorphous silicon layer 104. In an embodiment, the selected deposition conditions 910 comprise providing a feed gas. In an embodiment, the feed gas comprises silane. One or more silane feed gases can be used in any combination. In an embodiment, the one or more silane gases are selected from $SiH_4$, $SiHCl_3$, $SiH_2Cl_2$, and $SiH_3Cl$. The amorphous silicon layer is formed from the silane feed gases.

Other gases can also be included while depositing the amorphous silicon sacrificial layer. For example, a non-reactive gas, e.g., a carrier gas, can be included with the silane in the feed gas. Inclusion of non-reactive gases in the feed gas tends to reduce the mobility of the silane feed gas and decrease the conformal coverage of the amorphous silicon film. Examples of non-reactive gases useful in the deposition of the sacrificial layer include helium, neon, argon, krypton, xenon, and combinations thereof. In an embodiment, the feed gas further comprises a non-reactive gas selected from helium and argon. The inclusion of non-reactive gas aids in providing a sacrificial layer with increased surface roughness. Preferably, the ratio of silane to non-reactive gas is in the range of about 1:10 to about 10:1. In an embodiment, the ratio of silane to non-reactive gas is in the range of about 1:10 to about 1:1. In an embodiment, the ratio of silane to non-reactive gas is in the range of about 1:8 to about 1:4.

The amorphous silicon can also be deposited in the presence of hydrogen, which is normally undesirable in MEMS device manufacturing. Non-reactive gases, such as helium and argon, may be used to displace hydrogen gas during the reaction. However, the expenses typically incurred in eliminating hydrogen from the reaction can be avoided because hydrogen is not as adverse to the formation of amorphous silicon at low temperature as it is to the formation of other sacrificial layers used in MEMS devices. In an embodiment, the feed gas further comprises hydrogen.

The amorphous silicon deposited at a low temperature, e.g., less than or equal to about 250° C., has a high surface roughness as compared to a sacrificial layer not formed under the selected deposition conditions described herein. Preferably, the selection of the deposition conditions is carried out such that the surface 105 of the sacrificial layer 104, as deposited, has a surface roughness that is greater than about 1.0 nm RMS. For example, one of ordinary skill in the art, guided by the disclosure herein, can utilize routine experimentation to select the deposition conditions so that the surface 105 of the sacrificial layer 104, as deposited, has a surface roughness that is greater than about 1.5 nm RMS. In an embodiment, the deposition conditions are selected so that the surface 105 of the sacrificial layer 104, as deposited, has a surface roughness that is greater than about 1.8 nm RMS.

The low deposition temperature used during formation of the sacrificial layer is advantageous for many reasons. At lower deposition temperatures, the sacrificial silicon is inhibited from forming in an organized columnar structure, and thus, an amorphous silicon film is formed as the sacrificial layer 104. Also, higher deposition rates desired for mass production of MEMS devices can be achieved, in part, because of the efficiencies that are present in using a low temperature process. In an embodiment, the deposition temperature is less than or equal to about 250° C., including each temperature value within that range. For example, the deposition temperature can be in the range of about 150° C. to about 250° C. In an embodiment, the deposition temperature is in the range of about 150° C. to about 200° C. In an embodiment, the deposition temperature is in the range of about 200° C. to about 250° C. In an embodiment, the deposition temperature is in the range of about 175° C. to about 225° C.

Once the deposition conditions have been selected, the process 900 in FIG. 9 continues at step 915 with the actual formation of a sacrificial layer 104 as shown in FIG. 10 under the selected deposition conditions 910. In an embodiment, the sacrificial layer 104 comprises silicon. In an embodiment, the silicon is homogeneous. In an embodiment, the silicon is heterogeneous. FIG. 10 illustrates an embodiment where the sacrificial layer 104 is homogeneous and FIG. 11 illustrates an embodiment where the sacrificial layer 204 is heterogeneous. In an embodiment, the silicon is amorphous.

Figure 10A:
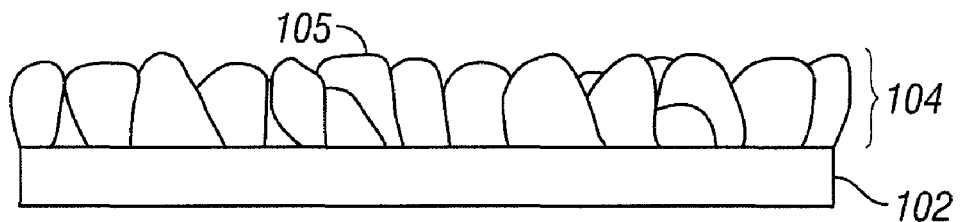
FIGS. 10A through 10C show an embodiment of processing steps of manufacturing a MEMS device.

FIG. 10 shows a cross section of various layers that can be used in manufacturing a MEMS device. In FIG. 10A, optical stack 102 is initially formed as described above and a sacrificial layer 104 is formed over the optical stack 102 according to the selected deposition conditions 910 described herein. Although not illustrated to scale, the sacrificial layer 104 has a rough surface 105 that is exposed on the opposite side of the optical stack 102.

The process 900 of FIG. 9 continues at step 925 by forming an overlying layer 106 over the sacrificial layer 104. In an embodiment, the overlying layer 106 is a moveable reflective layer 14 as described above in FIGS. 1 and 7. In an embodiment, the overlying layer 106 is a metal layer. Any suitable metal material in a MEMS device can be used in the metal layer formed over the sacrificial layer. In an embodiment, the metal layer comprises a metal selected from aluminum, nickel, and alloys thereof. In an embodiment, the metal layer comprises aluminum. An interface 107 is formed between the overlying metal layer 106 and the sacrificial layer 104. The roughness at the surface 105 of the sacrificial layer 104 is essentially transferred to the overlying metal layer 106 at the interface 107.

Figure 10B:
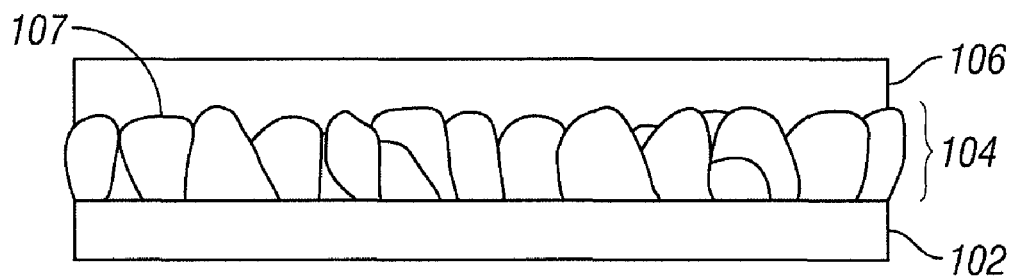

Before removal of the sacrificial layer, the layers shown in FIG. 10B are representative of layers in an unreleased MEMS substrate. In an embodiment, the unreleased MEMS substrate comprises an optical stack 102, a sacrificial layer 104 comprising amorphous silicon, and a metal layer 106 overlaying and forming an interface 107 with the sacrificial layer. In an embodiment, the interface 107 of the sacrificial layer 104 and the overlying metal layer 106 comprises a roughness that is effective to reduce stiction between the metal layer and the optical stack after removal of the sacrificial layer 106 to form a cavity.

Figure 10C:
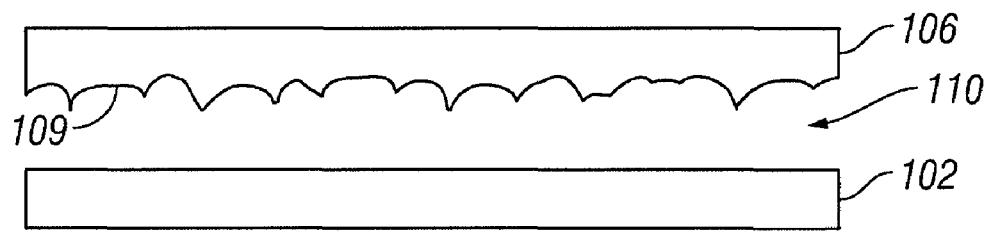
Figure 11A:
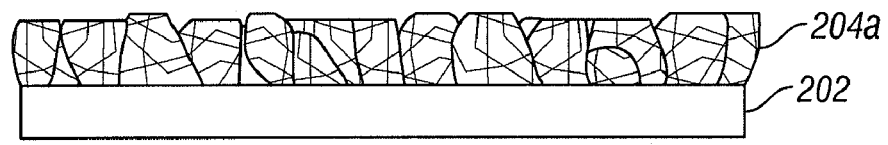
FIGS. 11A through 11D show another embodiment of processing steps of manufacturing a MEMS device.
Figure 11B:
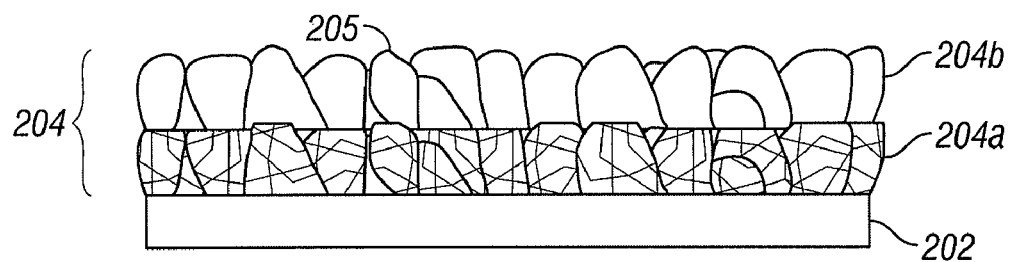
Figure 11C:
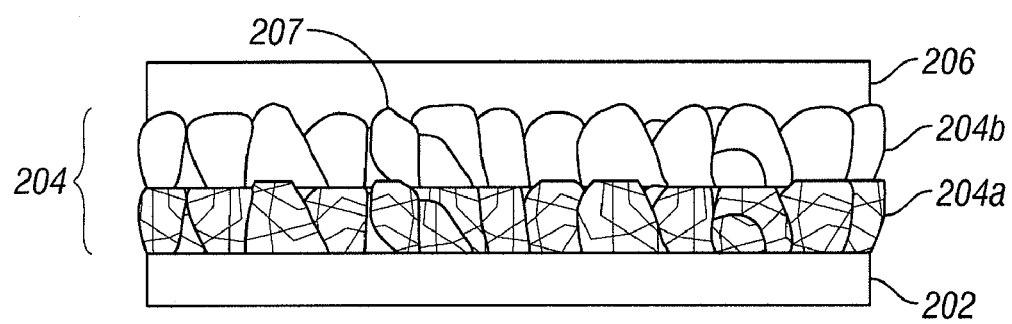
Figure 11D:
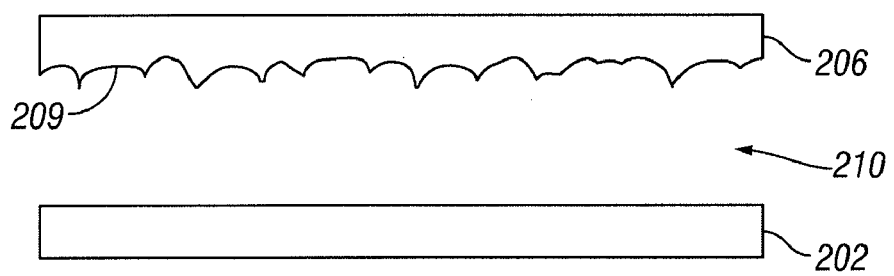

The interface 107 has a roughness that is approximately the same as that of the rough surface 105 of the sacrificial layer 104 before formation of the overlying layer 106. Such roughness is obtained by selecting the appropriate deposition conditions to form the sacrificial layer as described herein. In an embodiment, the interface has a roughness that is greater than about 1.0 nm RMS. In an embodiment, the interface has a roughness that is greater than about 1.5 nm RMS. In an embodiment, the interface has a roughness that is greater than about 1.8 nm RMS. As shown in FIG. 10C, upon removal of the sacrificial material to form a cavity, the metal layer 106 has a surface 109 with a roughness that is approximately the same as that of the interface 107 before removal of the sacrificial layer 104, such that the surface 109 is effective to reduce stiction.

The process 900 continues at step 930 where at least a portion of the sacrificial layer is removed (e.g., by etching) to form a cavity. One or more support structures or posts (not shown in FIG. 10), e.g., support structures or posts as described in FIGS. 1, 7, and 8, can support the overlying layer 106, thereby forming a gap or a cavity 110. In some embodiments, the cavity 110 is formed between the optical stack 102 and the overlying metal layer 106 such that the overlying metal layer 106 is exposed to the cavity 110. The surface 109 of the overlying metal layer 106 has a roughness that mirrors the roughness of the rough surface 105 of the sacrificial layer 104 before its removal and thus, stiction between the overlying layer 106 and the optical stack 102 can be substantially reduced.

The removal of the sacrificial layers can be accomplished, for example, by exposure to an etchant such as $XeF_2$, $F_2$ or HF alone, or in combination. In an embodiment, the etchant comprises $XeF_2$. In an embodiment, substantially the entire sacrificial layer 104 is removed in the etching process. In an embodiment, the cavity 110 is an interferometric cavity between an optical stack 102 (comprising an electrically conductive layer and the dielectric layer) and the overlying metal layer 106, which is a movable conductive layer as discussed above. After formation of the cavity 110, the resulting MEMS device, e.g., the interferometric modulator, is in a "released" state.

Once the overlying metal layer 106 has been released, the surface 109 of the metal layer 106 then has a surface roughness that is effective to reduce stiction between the overlying metal layer 106 and the optical stack 102. For example, the surface roughness of the metal layer can be greater than about 1.0 nm RMS. In an embodiment, the surface roughness of the metal layer is greater than about 1.5 nm RMS. In an embodiment, the surface roughness of the metal layer is greater than about 1.8 nm RMS.

In some embodiments, the process 900 may include additional steps, e.g., steps used in manufacturing an interferometric modulator, and the steps may be rearranged from the illustrations of FIGS. 8 and 9. For example, support structures may be formed before or after the sacrificial layer is formed. One can eliminate the step of forming support structure apertures by forming the support structures before providing the sacrificial material.

In an embodiment, the method of manufacturing a MEMS device further comprises forming a support structure to support the overlying metal layer over the optical stack after removal of the sacrificial layer to form a cavity. In an embodiment, forming the support structure comprises removing at least a portion of the sacrificial material to form an aperture. In an embodiment, the method comprises filling the aperture with a support material as described above.

FIG. 11 represents another embodiment of manufacturing a MEMS device that includes selecting appropriate deposition conditions and forming a sacrificial layer described herein in accordance with the process flow diagram of FIG. 9. FIG. 11 differs from FIG. 10 in that the selected deposition conditions 910 and formation of sacrificial layer 915 steps of FIG. 9 are varied such that the sacrificial layer 204 is heterogeneous, rather than homogeneous. However, all embodiments that embrace layers 102, 104, and 106 in FIG. 10 can be considered useful in layers 202, 204, and 206 of FIG. 11. The process steps 905, 925, and 930 from FIG. 9 discussed above in the embodiments embraced by FIG. 10 are also applicable in the embodiments embraced by FIG. 11.

Deposition conditions can be adjusted during the course of depositing amorphous silicon onto the optical stack. For example, the feed gas can be doped with an additional reactant gas that alters the morphology of the silicon during the course of its deposition. Examples of reactants include $N_2$, $N_2O$, $NH_3$, $NF_3$, $O_2$, and combinations thereof. Adding a reactant, as described herein, to the feed gas during deposition forms one or more of a silicon oxide, a silicon nitride, a silicon oxynitride, and amorphous silicon. In an embodiment, the selected deposition conditions comprise varying the amount of the reactant in the feed gas during the depositing of the sacrificial layer such that the sacrificial layer comprises a compositionally heterogeneous material. In an embodiment, the feed gas further comprises $N_2O$.

While adhesion of amorphous silicon to the optical stack without using a reactant in the feed gas is often acceptable, an advantage provided by the introduction of a reactant to the feed gas is that the resulting deposited layer has greater adhesion to the optical stack than without reactant. Improving adhesion to the optical stack, however, may reduce the surface roughness of the sacrificial material. In order to maintain the improved surface roughness as described above in FIGS. 9 and 10, the reactant can be removed from the feed gas after initial formation of a lower region of the amorphous silicon layer. FIG. 11 illustrates the formation and removal of a heterogeneous amorphous silicon sacrificial layer.

In reference to FIGS. 9 and 11, the step 910 of selecting deposition conditions can include providing a reactant in the feed gas at the beginning of the deposition of the sacrificial layer 204 over the optical stack 202. The reactant in the feed gas can then be reduced and/or eliminated as the amorphous silicon layer 204 forms. During the step 915 of forming the sacrificial layer, the amorphous sacrificial layer 204 forms a lower region 204a and an upper region 204b, the lower region 204a being compositionally distinct from the upper region 204b. As seen in FIG. 11B, the lower region 204a comprises a region of amorphous silicon that has a surface that is not as rough as that described in FIG. 10. However, the lower region 204a has enhanced adhesion to the optical stack 202, as compared to adhesion of the upper region 204b (e.g., non-doped amorphous silicon). The surface roughness ultimately transferred to the overlying metal layer 206 is not affected, however, because the upper region 204b of the amorphous silicon sacrificial layer 204 is formed in the absence of the reactant gas and the high surface roughness is maintained.

The size of the lower region 204a and the upper region 204b represented in FIG. 11 is not to scale. The relative sizes of the regions can be adjusted by a person having ordinary skill in the art using routine experimentation guided by the disclosure herein to provide appropriate sizes of the regions. Ideally, the lower region 204a would be provided in an amount sufficient for adhesion to the optical stack and the remainder would be the upper region 204b to provide surface roughness. For example, the lower region 204a, or adhesion region, can have a thickness less than about several hundred angstroms in order to achieve sufficient adhesion without compromising the final surface roughness of the deposited amorphous silicon film. In an embodiment, the lower region 204a comprises one or more of a silicon oxide, a silicon nitride, a silicon oxynitride, and amorphous silicon. In an embodiment, the upper region has distinct surface topography, as compared to the surface topography of the lower region.

The step 925 of forming an overlying layer 206 over the sacrificial layer 204 can then be performed to form an interface 207 such that the surface roughness of the interface 207 is as described above with regard to FIG. 10. Both the lower region 204a and the upper region 204b may be removed by the etching process described above to form an overlying metal layer 206 with a surface 209 having high roughness sufficient to inhibit stiction. In an embodiment, substantially the entire sacrificial layer 204 is removed in the etching process. In an embodiment, the resulting cavity 210 is an interferometric cavity between an optical stack 202 (comprising e.g., an electrically conductive layer and a dielectric layer) and the overlying metal layer 206, which is a movable conductive layer as discussed above.

EXAMPLES

For each of the amorphous silicon depositions, a partially fabricated interferometric modulator substrate was positioned within a process chamber of a PECVD deposition system. The PECVD system was configured as two parallel plates, an upper plate and a lower plate, contained inside a vacuum chamber. The upper plate resembled a showerhead for supplying gases and the lower plate was a heated wafer platen.

Each substrate used to form the samples was previously deposited with several patterned metal and dielectric thin-film layers comprising optical absorber, bottom electrode, and insulator stacks. The wafer platen was heated to a temperature between 150° C. and 250° C. and maintained during the deposition process. After a substrate was introduced into the chamber, the chamber was immediately evacuated to a base pressure of approximately 50 mTorr. Precursor, diluents, and doping gases in a predetermined mixture, described below for each, were then flowed into the chamber through the upper plate shower head electrode while the substrate's temperature and the chamber preset pressure were stabilized.

After a period of about thirty seconds, once the pressure stabilized, plasma was struck using a RF power supply connected to the showerhead. The platen supporting the wafer was either grounded or connected to a lower frequency bias. After the preset power was applied through the shower head, the plasma was controlled and maintained using an external RF matching network which monitored and tuned the RF current and reflected power. Hence, in-situ monitoring of the deposition process was achieved by tracking the RF current, gas flow, substrate temperature, and chamber pressure parameters. Using the energy from the plasma, precursor gas molecules were broken up into reactive radicals and species and transported onto the surface of the substrate. Precursor species reacted with each other to form stable molecules on the wafer's surface, which nucleated together into islands, which later merged into a solid continuous sacrificial layer.

When incorporating a reactant gas, the reactant was introduced into the feed gas by adjusting the process gas constituents and ratios. Large amounts of reactant gas could create residue during the etch release process. However, the amount of reactant gas incorporated into the film can be controlled by monitoring the refractive index of the film layer, since the amount of reactant inside the film tends to affect the refractive index. Thus, the reactant gas is provided in an amount such that the refractive index of the amorphous silicon remains above 3.3.

After the feed gas is doped with reactant and an amorphous silicon region is formed at a thickness less than several hundred angstroms, flow of the reactant gas into the process gas mixture was halted. The upper region of amorphous silicon film is deposited until the final overall a-Si layer thickness is achieved.

Comparative Examples 1 and 2

A standard PVD molybdenum sacrificial layer commonly used in the art was formed (comparative example 1). A second comparative example of standard high-temperature amorphous silicon was also formed. Comparative example 2 was formed at a temperature of 350° C. while flowing $SiH_4$ at a flow rate of 110 standard cubic centimeters per minute (sccm) and He at a flow rate of 2000 sccm.

Examples 3-7

Homogeneous Non-Doped Amorphous Silicon Layers as Sacrificial Layers

Example 3 was amorphous silicon formed at a temperature of 200° C. while flowing $SiH_4$ at a flow rate of 120 sccm. Example 4 was amorphous silicon formed at a temperature of 200° C. while flowing $SiH_4$ at a flow rate of 40 sccm and He at a flow rate of 500 sccm. Example 5 was amorphous silicon formed at a temperature of 200° C. while flowing $SiH_4$ at a flow rate of 60 sccm and He at a flow rate of 1500 sccm. Example 6 was amorphous silicon formed at a temperature of 200° C. while flowing $SiH_4$ at a flow rate of 60 sccm and He at a flow rate of 500 sccm. Example 7 was amorphous silicon formed at a temperature of 200° C. while flowing $SiH_4$ at a flow rate of 80 sccm and He at a flow rate of 500 sccm.

Examples 8-9

Homogeneous Doped Amorphous Silicon Layers as Sacrificial Layers

Example 8 was amorphous silicon formed at a temperature of 200° C. while flowing $SiH_4$ at a flow rate of 80 sccm, He at a flow rate of 500 sccm, and $N_2O$ at a flow rate of 10 sccm. Example 9 was amorphous silicon formed at a temperature of 200° C. while flowing $SiH_4$ at a flow rate of 100 sccm, He at a flow rate of 500 sccm, and $N_2O$ at a flow rate of 10 sccm.

Examples 10-11

Heterogeneous Amorphous Silicon Layers as Sacrificial Layers

Examples 10 and 11 were each created with compositionally distinct upper and lower regions. The lower region of Example 10 was amorphous silicon formed at a temperature of 150° C. while flowing $SiH_4$ at a flow rate of 60 sccm, He at a flow rate of 1500 sccm, and $N_2O$ at a flow rate of 10 sccm. The upper region of Example 10 was amorphous silicon formed at a temperature of 180° C. while flowing $SiH_4$ at a flow rate of 80 sccm and He at a flow rate of 500 sccm. The lower region of Example 11 was amorphous silicon formed at a temperature of 180° C. while flowing $SiH_4$ at a flow rate of 80 sccm, He at a flow rate of 500 sccm, and $N_2O$ at a flow rate of 20 sccm. The upper region of Example 11 was amorphous silicon formed at a temperature of 180° C. while flowing $SiH_4$ at a flow rate of 80 sccm and He at a flow rate of 500 sccm.

Each of the examples was measured for the RMS surface roughness. Some of the examples were formed into MEMS devices and the time to stiction was measured. The results are given below in Table 1.

TABLE 1

|  | Surface Roughness (nm RMS) | Time-to-stiction (min) @ 1.8 Va |
|---|---|---|
| Comp. Example 1 | 1.6 | 100 |
| Comp. Example 2 | 0.4 | <1 |
| Example 3 | 0.93 |  |
| Example 4 | 1.33 |  |
| Example 5 | 1.6 | 200 |
| Example 6 | 1.9 |  |
| Example 7 | 2.0 | 1000 |
| Example 8 | 1.3 | <5 |
| Example 9 | 1.5 | <5 |
| Example 10 | 1.4 |  |
| Example 11 | 1.6 |  |

As shown in Table 1, the surface roughness of the amorphous silicon sacrificial layers deposited at low-temperature, e.g., below about 250° C., was much higher than that of typical amorphous silicon sample deposited at higher temperature. The addition of the non-reactive gas, e.g., helium, provided higher surface roughness than without (Example 3). Additionally, the roughness values were similar to, and in some cases, higher than the roughness values for the molybdenum sacrificial layer. The amorphous silicon layers formed at low temperatures having an upper region formed without reactant gases (Examples 5 and 7) show superior time to stiction values for the MEMS device.

It should be noted that the embodiments described above are applicable to an interferometric modulator structure viewed from the opposite side, compared to that shown in FIG. 1. Such a configuration has a reflective electrode closer to the substrate (which need not be transparent) and a semi-transparent electrode farther from the substrate. Either or both electrodes could be made movable. In addition, although not shown, it should be noted that the embodiments of FIG. 8-11 may be combined with options of the embodiments described above with reference to FIGS. 1-7.

The above-described modifications may be utilized to provide a more robust design and fabrication. Additionally, while the above aspects have been described in terms of selected embodiments of the interferometric modulator, one of skill in the art will appreciate that many different embodiments of interferometric modulators may benefit from the above aspects. Of course, as will be appreciated by one of skill in the art, additional alternative embodiments of the interferometric modulator can also be employed. The various layers of interferometric modulators can be made from a wide variety of conductive and non-conductive materials that are generally well known in the art of semi-conductor and electro-mechanical device fabrication.

In addition, the embodiments, although described with respect to an interferometric modulator, are applicable more generally to other MEMS devices, particularly electrostatic MEMS with electrodes capable of relative movement, and can prevent stiction in an actuated or collapsed position.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. An unreleased MEMS substrate comprising:
   an optical stack;
   a sacrificial layer comprising amorphous silicon, wherein a thickness of the sacrificial layer is selected to provide a cavity suitable for interferometric modulation of light, after removal of the sacrificial layer; and
   a metal layer overlaying and forming an interface with the sacrificial layer;
   wherein the interface of the sacrificial layer and the metal layer comprises a surface roughness greater than about 1.0 nm RMS.

2. The unreleased MEMS substrate according to claim 1, wherein the interface has a roughness that is greater than about 1.5 nm RMS.

3. The unreleased MEMS substrate according to claim 1, wherein the interface has a roughness that is greater than about 1.8 nm RMS.

4. The unreleased MEMS substrate according to claim 1, wherein the sacrificial layer comprises a lower region and an upper region, the lower region being compositionally distinct from the upper region.

5. The unreleased MEMS substrate according to claim 4, wherein the lower region has enhanced adhesion to the optical stack, as compared to the upper region.

6. The unreleased MEMS substrate according to claim 5, wherein the lower region comprises one or more of a silicon oxide, a silicon nitride, a silicon oxynitride, and amorphous silicon.

7. The unreleased MEMS substrate according to claim 1, wherein the metal layer comprises aluminum.

8. The unreleased MEMS substrate according to claim 1, wherein the optical stack comprises a dielectric layer.

9. The unreleased MEMS substrate according to claim 8, wherein the dielectric layer comprises a dielectric material selected from a silicon oxide and an aluminum oxide.

10. The unreleased MEMS substrate according to claim 1, wherein the optical stack comprises an electrode layer and a partially reflective layer.

* * * * *

UNITED STATES PATENT AND TRADEMARK OFFICE
CERTIFICATE OF CORRECTION

PATENT NO. : 8,358,458 B2
APPLICATION NO. : 12/939909
DATED : January 22, 2013
INVENTOR(S) : Webster et al.

Page 1 of 1

It is certified that error appears in the above-identified patent and that said Letters Patent is hereby corrected as shown below:

In the Specification

In column 12 at line 44, Change "$Sin_4$," to --$SiH_4$,--.

Signed and Sealed this
Thirtieth Day of July, 2013

Teresa Stanek Rea
*Acting Director of the United States Patent and Trademark Office*